(12) United States Patent
Li et al.

(10) Patent No.: US 10,698,266 B2
(45) Date of Patent: Jun. 30, 2020

(54) LIQUID CRYSTAL DISPLAY DEVICE

(71) Applicant: SHIJIAZHUANG CHENGZHI YONGHUA DISPLAY MATERIAL CO., LTD., Shijiazhuang, Hebei (CN)

(72) Inventors: Xuefeng Li, Shijiazhuang (CN); Kelun Shu, Shijiazhuang (CN); Kai Xu, Shijiazhuang (CN); Lihong Gui, Shijiazhuang (CN); Qian Zhang, Shijiazhuang (CN); Zhengqiang Li, Shijiazhuang (CN); Yunxia Qiao, Shijiazhuang (CN); Qing Cui, Shijiazhuang (CN)

(73) Assignee: SHIJIAZHUANG CHENGZHI YONGHUA DISPLAY MATERIAL CO., LTD., Shijiazhuang, Hebei (CN)

( * ) Notice: Subject to any disclaimer, the term of this patent is extended or adjusted under 35 U.S.C. 154(b) by 106 days.

(21) Appl. No.: 16/108,249

(22) Filed: Aug. 22, 2018

(65) Prior Publication Data
US 2019/0353962 A1 Nov. 21, 2019

(30) Foreign Application Priority Data
May 18, 2018 (CN) .......................... 2018 1 0482506

(51) Int. Cl.
| | |
|---|---|
| C09K 19/20 | (2006.01) |
| G02F 1/1337 | (2006.01) |
| C09K 19/30 | (2006.01) |
| C09K 19/44 | (2006.01) |
| G02F 1/1333 | (2006.01) |
| H01L 27/12 | (2006.01) |
| C09K 19/34 | (2006.01) |

(52) U.S. Cl.
CPC ........ *G02F 1/133707* (2013.01); *C09K 19/20* (2013.01); *C09K 19/3066* (2013.01); *C09K 19/44* (2013.01); *G02F 1/133345* (2013.01); *C09K 2019/301* (2013.01); *C09K 2019/3004* (2013.01); *C09K 2019/3009* (2013.01); *C09K 2019/3016* (2013.01); *C09K 2019/3021* (2013.01); *C09K 2019/3422* (2013.01); *H01L 27/1214* (2013.01)

(58) Field of Classification Search
CPC ....................................................... C09K 19/00
See application file for complete search history.

(56) References Cited

U.S. PATENT DOCUMENTS

| | | | |
|---|---|---|---|
| 2018/0016499 A1* | 1/2018 | Wu ................... | G02F 1/134309 |
| 2018/0119012 A1* | 5/2018 | Shu ........................ | C09K 19/32 |

* cited by examiner

*Primary Examiner* — Chanceity N Robinson
(74) *Attorney, Agent, or Firm* — Paratus Law Group, PLLC

(57) ABSTRACT

Disclosed is a liquid crystal display device comprising an array substrate and an opposite substrate arranged facing the array substrate, and further comprises a liquid crystal composition located between said array substrate and the opposite substrate, wherein said array substrate comprises elongated and evenly spaced slit electrodes and electrode gaps between the slit electrodes, with the slit electrodes and the electrode gaps said being located in the same layer structure; said array substrate comprises a bulk electrode below the slit electrodes; and said array substrate further comprises an insulating layer between the slit electrodes and the bulk electrode. The liquid crystal display device has a higher light transmittance, such that more backlight passes through the liquid crystal display device, resulting in the liquid crystal display device having a higher luminance.

10 Claims, 2 Drawing Sheets

LIQUID CRYSTAL DISPLAY DEVICE

CROSS REFERENCE TO PRIOR APPLICATION

This application claims priority to Chinese Patent Application No. 201810482506.9 (filed on May 18, 2018), which is hereby incorporated by reference in its entirety.

TECHNICAL FIELD

The present invention relates to the technical field of liquid crystal displays. More specifically, the present invention relates to a liquid crystal display device.

BACKGROUND ART

At present, the expansion of application range of liquid crystal compounds becomes larger and larger, and the liquid crystal compounds can be used in various types of displays, electro-optical devices, sensors and the like. There are a great variety of liquid crystal compounds used in the above-mentioned display field, wherein nematic liquid crystals are used most extensively. Nematic phase liquid crystals have been used in passive TN and STN matrix displays and systems having a TFT active matrix.

With regard to the application field of thin film transistor techniques (TFT-LCD), although the market in recent years has become very huge, and the techniques also become gradually mature, requirements of display techniques are increasing continuously, especially in terms of achieving a quick response, reducing the drive voltage for reducing power consumption, etc. Liquid crystal materials, as one of the important optoelectronic materials for liquid crystal displays, play an important role in improving the performance of a liquid crystal display.

As liquid crystal materials, they need to have good chemical and thermal stability and stability to electric fields and electromagnetic radiations. Moreover, as liquid crystal materials used for thin film transistor techniques (TFT-LCD), they not only need to have the stabilities as mentioned above, but also should have properties, such as a broader nematic phase temperature range, a suitable birefringence anisotropy, a very high electrical resistivity, a good ultraviolet resistant property, a high charge retention rate, a low vapor pressure, etc.

As for dynamic picture display applications, the liquid crystal is required to have a very fast response speed in order to eliminate ghosting and trailing of display pictures, and therefore the liquid crystal is required to have a lower rotary viscosity $\gamma 1$; in addition, as for portable devices, in order to reduce the energy consumption of equipment, the driving voltage for the liquid crystal is desired to be as low as possible; and as for displays for use in televisions, etc., the requirements for the drive voltage for the liquid crystal are not as low as that.

The viscosity, in particular rotary viscosity $\gamma_1$, of a liquid crystal compound directly affects the response time after the liquid crystal is energized, and both the rise time ($t_{on}$) and fall time ($t_{off}$) are proportional to the rotary viscosity $\gamma_1$ of the liquid crystal; moreover, since the rise time ($t_{on}$) is related to a liquid crystal cell and the drive voltage, same can be adjusted by increasing the drive voltage and reducing the thickness of the liquid crystal cell; however, the fall time ($t_{off}$) is irrelevant to the drive voltage, and is mainly related to the elastic constant of the liquid crystal and the thickness of the liquid crystal cell, and thinning of cell thickness can result in a decrease in the fall time ($t_{off}$); moreover, the movement manners of liquid crystal molecules in different display modes are different, and the three modes, i.e., TN, IPS and VA, are respectively inversely proportional to the mean elastic constant K, twist elastic constant and bend elastic constant.

According to the continuum theory of liquid crystal, a variety of different liquid crystals deformed under the action of an external force (an electric field, a magnetic field) can "rebound" back to the original shapes by intermolecular interactions; likewise, liquid crystals also form a "viscosity" due to the intermolecular force. Small changes of liquid crystal molecules may result in obvious changes in the conventional parameter performance of the liquid crystal, wherein for some of these changes, there is a certain rule, while for some changes, it is difficult to find a rule, which may also have obvious effects on the intermolecular interaction of the liquid crystal, these effects are very subtle, and to date, no perfect theoretical explanation has been formed yet.

The viscosity of a liquid crystal is related to the molecular structure of the liquid crystal, and studying the relationship between the viscosity of a liquid crystal system formed from different liquid crystal molecules and the molecular structures of the liquid crystals is one of important tasks of liquid crystal formulation engineers.

The reason why a liquid crystal display panel has a high energy consumption is that only about 5% of backlight can transmit through a display device and then be captured by human eyes, while most of the light is "wasted". If a liquid crystal having a high light transmittance can be developed, then the backlight intensity can be reduced, thereby achieving the purpose of saving energy consumption and extending the service time of a device.

Therefore, there is a need to provide a new liquid crystal display device.

SUMMARY OF THE INVENTION

An object of the present invention is to provide a liquid crystal display device, which has the characteristics of a high light transmittance, a high luminance, and saving energy.

In order to achieve the above-mentioned object, the following technical solution is used in the present invention:

A liquid crystal display device comprising an array substrate and an opposite substrate arranged facing the array substrate, characterized in that further comprising a liquid crystal composition between said array substrate and the opposite substrate, wherein said array substrate comprises elongated and evenly spaced slit electrodes and electrode gaps between the slit electrodes, with the slit electrodes and the electrode gaps being located in the same layer structure; said array substrate comprises a bulk electrode below the slit electrodes; and said array substrate further comprises an insulating layer between the slit electrodes and the bulk electrode.

Preferably, the ratio of the width of said slit electrode to the width of said electrode gap is 1:1 to 1:9.

Preferably, the ratio of the width of said slit electrode to the width of said electrode gap is 1:1 to 1:2.

Preferably, when said liquid crystal composition exhibits dielectrically positive characteristics, the included angle between the lengthwise direction of said slit electrodes and the initial alignment direction of liquid crystal molecules in the liquid crystal composition in the lengthwise direction is 5° to 450°.

Preferably, when said liquid crystal composition exhibits dielectrically positive characteristics, the included angle between the lengthwise direction of said slit electrodes and the initial alignment direction of liquid crystal molecules in the liquid crystal composition in the lengthwise direction is 5° to 15°.

Preferably, when said liquid crystal composition exhibits dielectrically negative characteristics, the included angle between the lengthwise direction of said slit electrodes and the initial alignment direction of liquid crystal molecules in the liquid crystal composition in the lengthwise direction is 45° to 85°.

Preferably, when said liquid crystal composition exhibits dielectrically negative characteristics, the included angle between the lengthwise direction of said slit electrodes and the initial alignment direction of liquid crystal molecules in the liquid crystal composition in the lengthwise direction is 75° to 85°.

Preferably, said liquid crystal composition comprises one or more compounds represented by formula I, and one or more compounds represented by formula II:

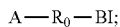

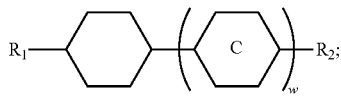

wherein

A represents a group having a dielectric constant of greater than 0, and B represents a group having a dielectric constant of less than 0;

$R_0$ represents one or more of $CF_2O$, $OCF_2$, $OCF_2O$, CHFO, OCHF, OCHFO, $CF_2$, CHF, $CH_2$, $CH_2CH_2$, $CHFCH_2$, $CH_2CHF$, CHFCHF, $CF_2CH_2$, $CH_2CF_2$, $CF_2CHF$, $CHFCF_2$, $CF_2CF_2$, CHCH, CFCH, CHCF, CFCF, Si, N, O, S, $CR*_2CR**_2$, $CR*FCR**_2$, $CR*_2CR**F$, $CR*FCRF$, $CF_2CR_2$, $CR*_2CF_2$, $CF_2CR**F$, $CR*FCF_2$, $CR*CR$, $CFCR$, $CR*CF$,

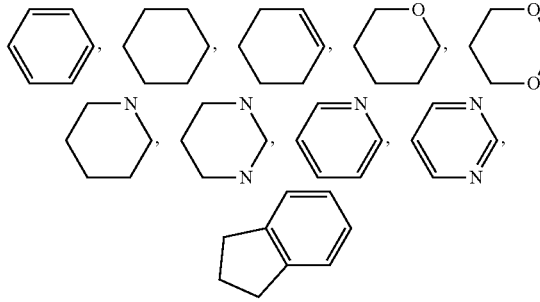

and/or any fluorobenzene;

R* and R** each independently represent H, an alkyl group having a carbon atom number of 1-10, an alkoxy group having a carbon atom number of 1-10, an alkenyl group having a carbon atom number of 2-10, or an alkenoxy group having a carbon atom number of 3-8;

$R_1$ and $R_2$ each independently represent an alkyl group having a carbon atom number of 1-10, an alkoxy group having a carbon atom number of 1-10, an alkenyl group having a carbon atom number of 2-10 or an alkenoxy group having a carbon atom number of 3-8, and any one or more non-connected $CH_2$ in the groups represented by $R_1$ and $R_3$ may be substituted with cyclopentyl, cyclobutyl, cyclopropyl, or —O—;

represents one or more of

or any fluorobenzene;

and w represents 1, 2 or 3.

Preferably, A represents a group represented by formula V, and B represents one of groups represented by formulae VI1 to VI3;

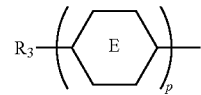

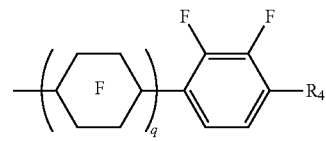

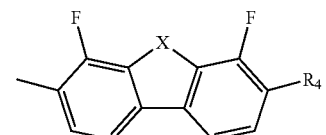

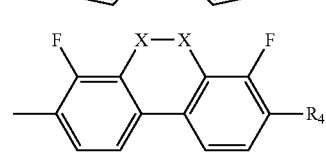

wherein $R_3$ and $R_4$ represent an alkyl group having a carbon atom number of 1-10, fluoro, a fluoro-substituted alkyl group having a carbon atom number of 1-10, an alkoxy group having a carbon atom number of 1-10, a fluoro-substituted alkoxy group having a carbon atom number of 1-10, an alkenyl group having a carbon atom number of 2-10, a fluoro-substituted alkenyl group having a carbon atom number of 2-10, an alkenoxy group having a carbon atom number of 3-8 or a fluoro-substituted alkenoxy group having a carbon atom number of 3-8, and any one or more $CH_2$ in the groups represented by $R_3$ and $R_4$ may be substituted with cyclopentyl, cyclobutyl or cyclopropyl;

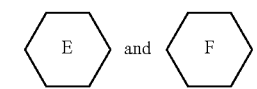

and each independently represent one or more of

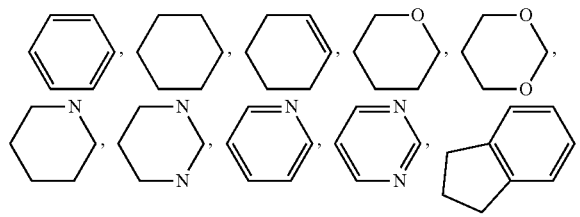

and any fluorobenzene;
each X independently represents $CH_2$, O or S;
p represents 1, 2 or 3;
and q represents 0, 1 or 2.

Preferably, said liquid crystal composition further comprises one or more compounds represented by formula III:

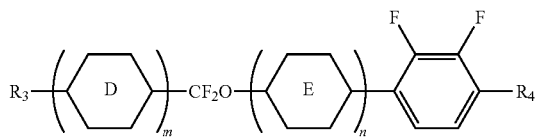

wherein
$R_3$ represents an alkyl group having a carbon atom number of 1-10, an alkoxy group having a carbon atom number of 1-10, an alkenyl group having a carbon atom number of 2-10 or an alkenoxy group having a carbon atom number of 3-8, and any one or more non-connected $CH_2$ in the groups represented by $R_3$ may be substituted with cyclopentyl, cyclobutyl, cyclopropyl, or —O—;
$R_4$ represents F, $CF_3$, $OCF_3$, $OCHF_2$ or $OCH_2F$;

represents one or more of

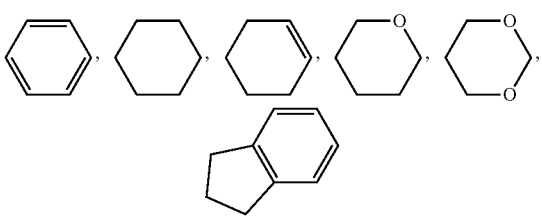

or any fluorobenzene;

represents one or two of benzene or fluorobenzene;
m represents 1, 2 or 3; and n represents 0 or 1.

Preferably, said one or more compounds represented by formula I are one or more of compounds represented by formulae I-1 to I-3 below:

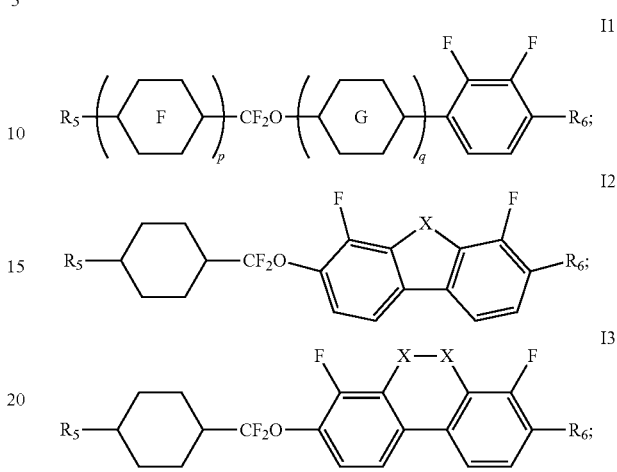

wherein
$R_5$ and $R_6$ each independently represent an alkyl group having a carbon atom number of 1-10, fluoro, a fluoro-substituted alkyl group having a carbon atom number of 1-10, an alkoxy group having a carbon atom number of 1-10, a fluoro-substituted alkoxy group having a carbon atom number of 1-10, an alkenyl group having a carbon atom number of 2-10, a fluoro-substituted alkenyl group having a carbon atom number of 2-10, an alkenoxy group having a carbon atom number of 3-8 or a fluoro-substituted alkenoxy group having a carbon atom number of 3-8, and any one or more $CH_2$ in the groups represented by $R_5$ and $R_6$ may be substituted with cyclopentyl, cyclobutyl or cyclopropyl;

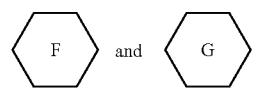

each independently represent one or more of

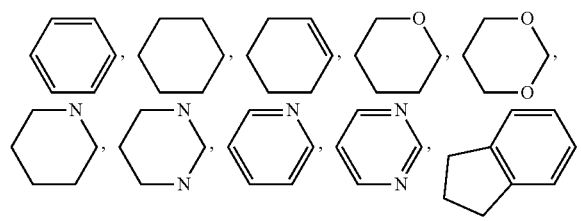

or any fluorobenzene;
each X independently represents $CH_2$, O or S;
p represents 1, 2 or 3; and q represents 0, 1 or 2.

Preferably, said compound represented by formula II is selected from one of compounds represented by formulae I1-1 to I1-4 below, said compound represented by formula I2 is selected from one of compounds represented by formulae I2-1 to I2-8 below, and said compound represented by formula I3 is selected from one of compounds represented by formulae I3-1 to I3-8 below, I1-1 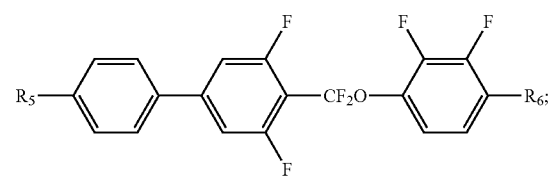
I1-2 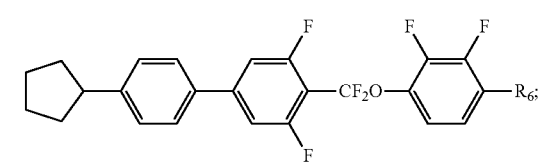
I1-3 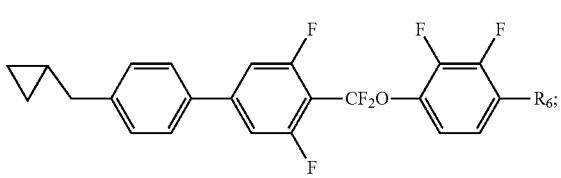
I1-4 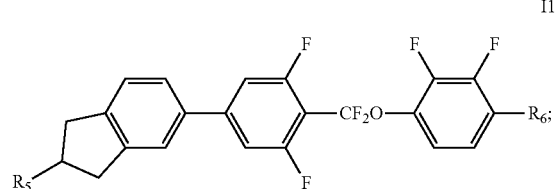
I1-5 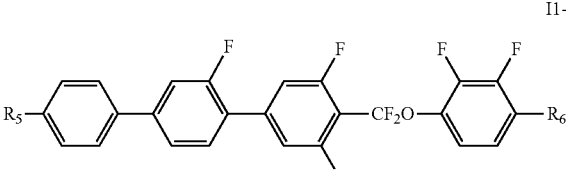
I1-6 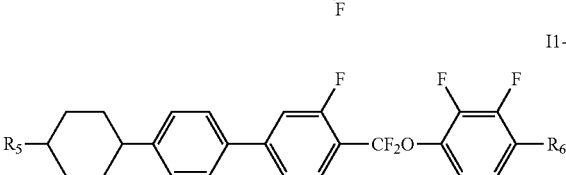
I1-7 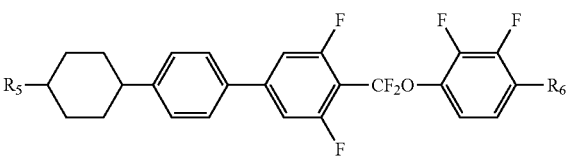
I1-8 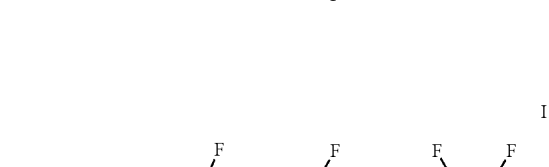
I1-9 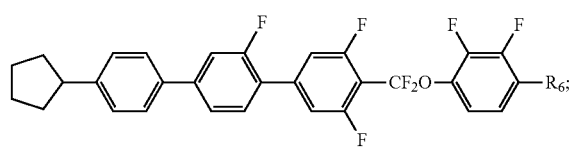
I1-10 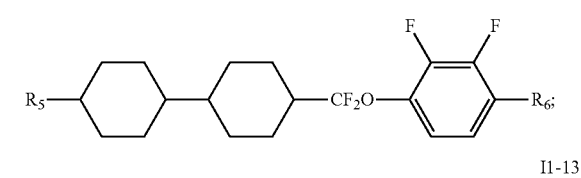
I1-11 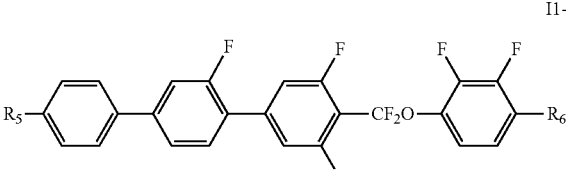
I1-12 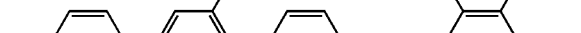
I1-13 
I1-14 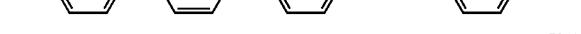
I2-1 
I2-2 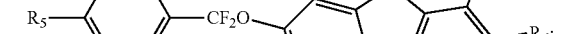
I2-3 

-continued

I2-4
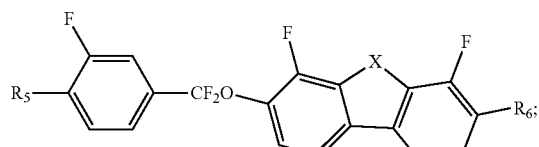

I2-5
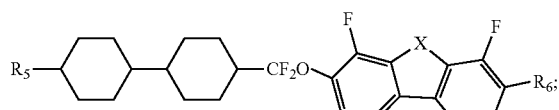

I2-6
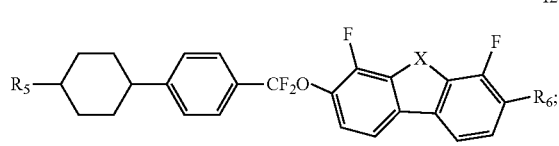

I2-7
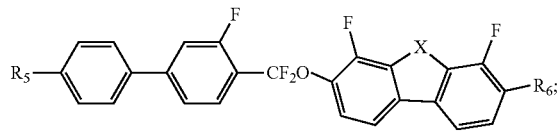

I2-8
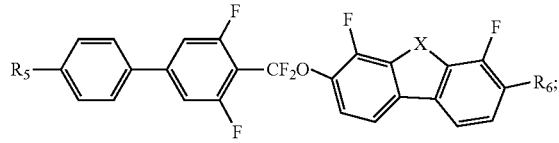

I3-1
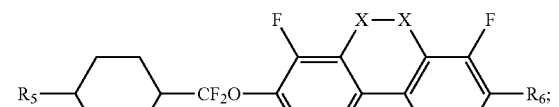

I3-2
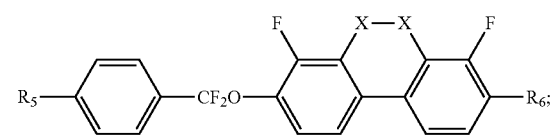

I3-3
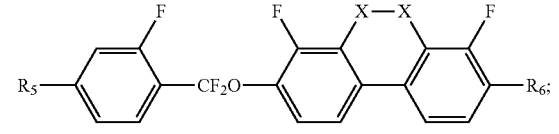

I3-4
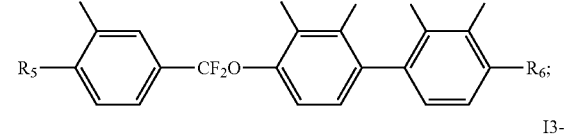

I3-5
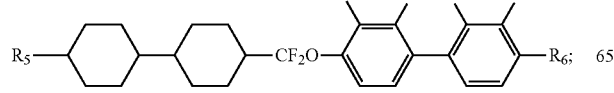

-continued

I3-6
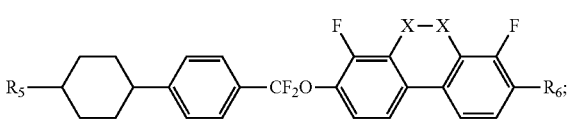

I3-7
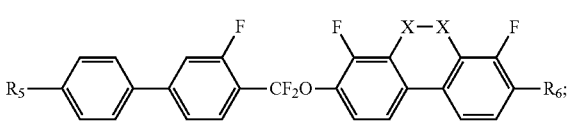

I3-8
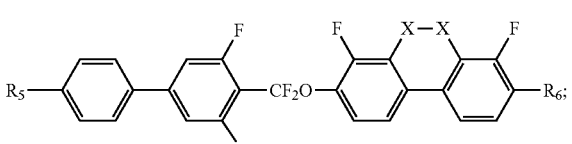

wherein $R_5$ and $R_6$ each independently represent an alkyl group having a carbon atom number of 1-10, fluoro, a fluoro-substituted alkyl group having a carbon atom number of 1-10, an alkoxy group having a carbon atom number of 1-10, a fluoro-substituted alkoxy group having a carbon atom number of 1-10, an alkenyl is group having a carbon atom number of 2-10, a fluoro-substituted alkenyl group having a carbon atom number of 2-10, an alkenoxy group having a carbon atom number of 3-8 or a fluoro-substituted alkenoxy group having a carbon atom number of 3-8, and any one or more $CH_2$ in the groups represented by $R_5$ and $R_6$ may be substituted with cyclopentyl, cyclobutyl or cyclopropyl;

and each X independently represents $CH_2$, O or S.

Preferably, said one or more compounds represented by formula II are selected from one or more of compounds represented by formulae II1 to II5 below, and said one or more compounds represented by formula III are selected from one or more of compounds represented by formulae III1 to III14 below:

II1
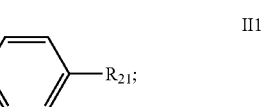

II2
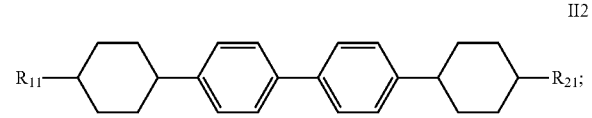

II3
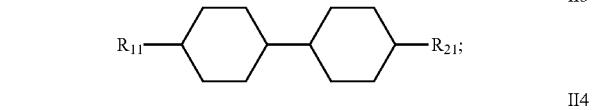

II4
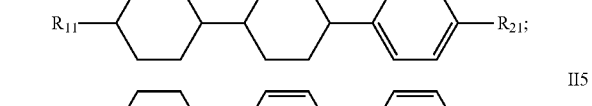

II5

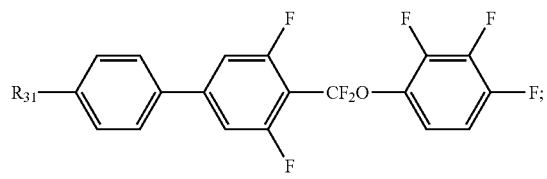

III1

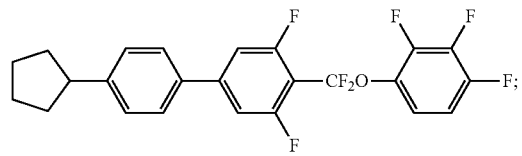

III2

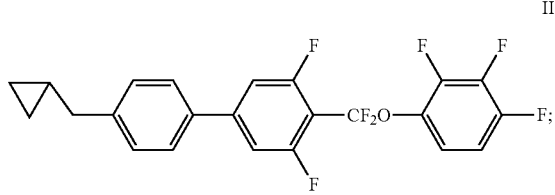

III3

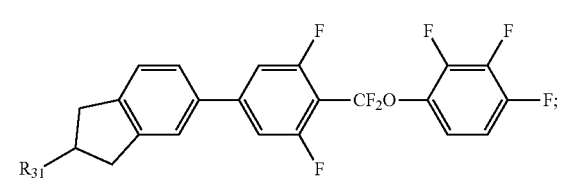

III4

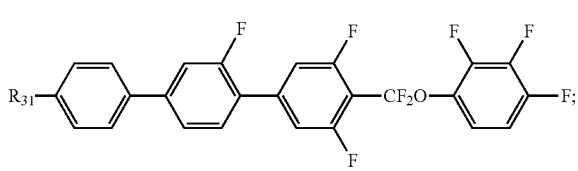

III5

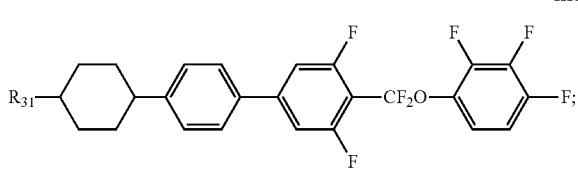

III6

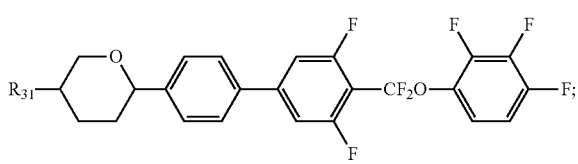

III7

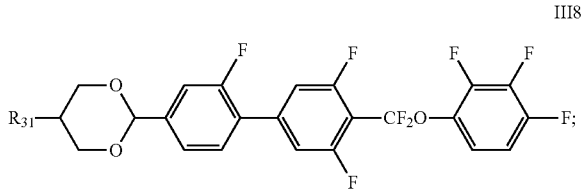

III8

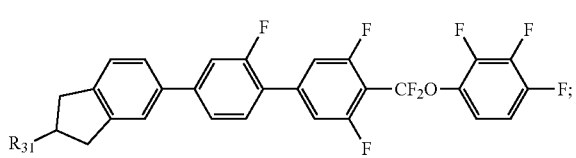

III9

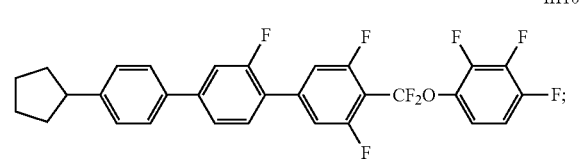

III10

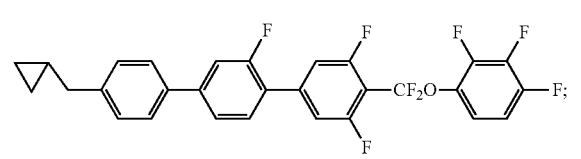

III11

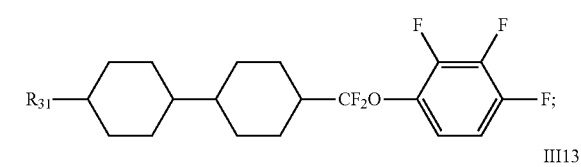

III12

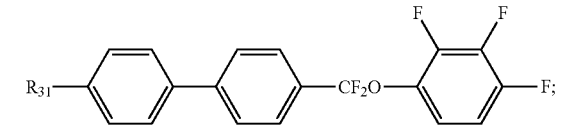

III13

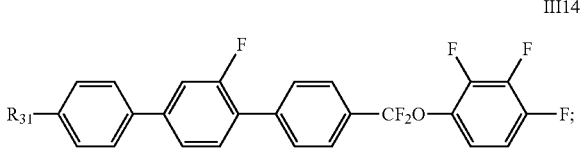

III14 wherein $R_{11}$ and $R_{21}$ each independently represent an alkyl group having a carbon atom number of 1-6, an alkoxy group having a carbon atom number of 1-6, an alkenyl group having a carbon atom number of 2-6 or an alkenoxy group having a carbon atom number of 3-6;

and $R_{31}$ represents an alkyl group having a carbon atom number of 1-6.

The initial alignment direction of the above-mentioned liquid crystal molecules in the lengthwise direction is determined by a material or a process, the material or process including but not limited to a rubbing alignment film material, a photoalignment film material, and other alignment methods that do not require an alignment film.

The Present Invention has the Following Beneficial Effects:

Compared with the prior art, the liquid crystal display device provided by the present invention has a higher light transmittance, such that more backlight passes through the liquid crystal display device, resulting in the liquid crystal display device having a higher luminance. Alternatively, due to the increase in transmittance, using less backlight can achieve the same luminance as that in the prior art, and less backlight means lower power consumption. That is to say, the liquid crystal display device provided by the present invention has a higher luminance or has the effect of energy saving and power saving.

BRIEF DESCRIPTION OF THE DRAWINGS

The particular embodiments of the present invention will be further described below in detail in conjunction with the drawings.

DETAILED DESCRIPTION OF EMBODIMENTS

Figure 1:
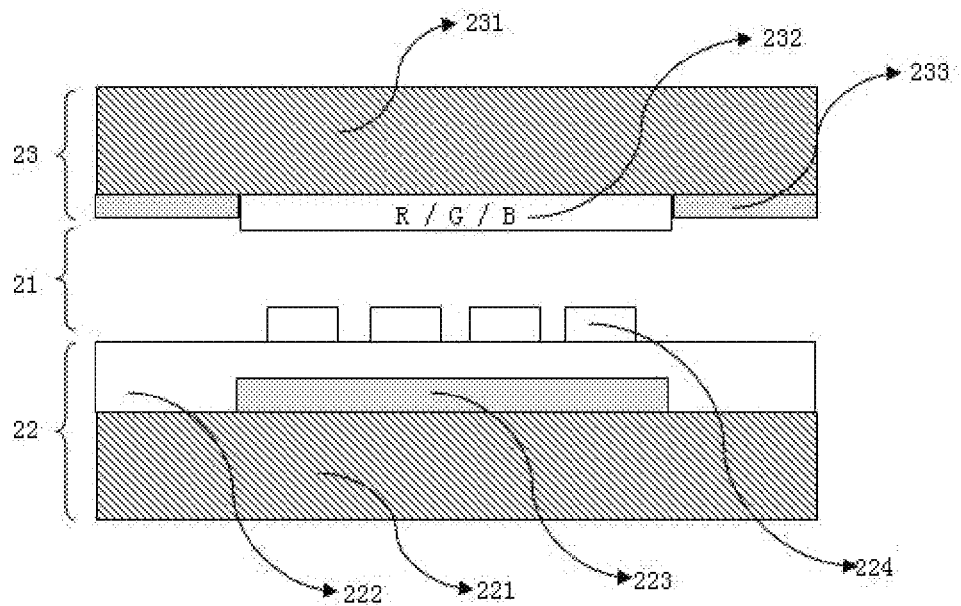
FIG. 1 shows a structural schematic diagram of a liquid crystal display panel provided in an embodiment of the present invention.

In order to illustrate the present invention more clearly, the present invention will be further described below in conjunction with preferred embodiments and the accompanying drawings. In the drawings, like parts are represented by the same reference sign. A person skilled in the art would understand that the following contents described in detail are illustrative rather than limiting, and should not limit the scope of protection of the present invention.

In this description, unless otherwise specified, percentages are weight percentages, temperatures are in degree Celsius (° C.), and the specific meanings of the other symbols and the test conditions are as follows:

w represents the width of the slit electrodes;

d represents the width of the electrode gaps between the slit electrodes;

φ represents the included angle between the lengthwise direction of the slit electrodes and the initial alignment direction of liquid crystal molecules in the lengthwise direction;

Cp represents the clearing point of the liquid crystal (° C.), as measured by means of a DSC quantitative method;

Δn represents the optical anisotropy, $n_o$ is the refractive index of an ordinary light, $n_e$ is the refractive index of an extraordinary light, and the test conditions are: 25±2° C., 589 nm and using an abbe refractometer for testing;

Δε represents the dielectric anisotropy, $Δε=ε_{//}-ε_⊥$ wherein the $ε_{//}$ is a dielectric constant parallel to a molecular axis, and $ε_⊥$ is a dielectric constant perpendicular to the molecular axis, and the test conditions are: 25±0.5° C., using a 20 micron parallel cell, and using INSTEC: ALCT-IR1 for testing;

γ1 represents a rotary viscosity (mPa·s), and the test conditions are: 25±0.5° C., using a 20 micron parallel cell, and using INSTEC: ALCT-IR1 for testing; and Tr (%) represents a transmittance, Tr (%)=100%*bright state (Vop) luminance/light source luminance, the test equipment is DMS501, and the test conditions are 25±0.5° C.; since $ε_⊥$ positively correlated with Tr, when inspecting the transmittance, $ε_⊥$ can be used as an inspection indicator to testify.

In the embodiments of the present invention, liquid crystal monomer structures are represented by codes, wherein the codes of cyclic structures, end groups and linking groups of liquid crystals are represented as shown in tables 1 and 2 below.

TABLE 1

Corresponding code for ring structure

| Ring structure | Corresponding code |
|---|---|
|  | C |
|  | P |
| 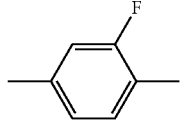 | G |
| 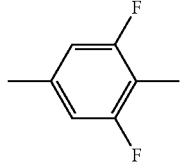 | U |
| 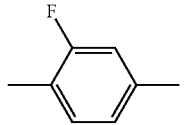 | GI |
|  | Y |
| 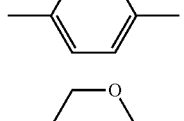 | A |
| 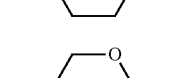 | D |
| 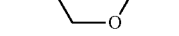 | BHHO-m-nEF |
| 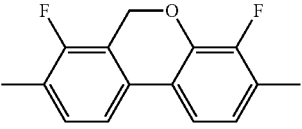 | B |
| 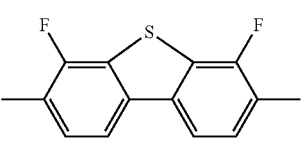 | B(S) |

TABLE 2

Corresponding code for end group and linking group

| End group and linking group | Corresponding code |
|---|---|
| $C_nH_{2n+1}-$ | n— |
| $C_nH_{2n+1}O-$ | nO— |
| $-OCF_3$ | OT |
| $-CF_3$ | —T |
| $-CF_2O-$ | Q |
| $-F$ | —F |
| $-CN$ | —N |
| $-CH_2CH_2-$ | E |
| $-CH=CH-$ | V |
| $-C\equiv C-$ | T |
| $-COO-$ | Z |
| $-CH=CH-C_nH_{2n+1}$ | —Vn |
| 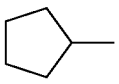 | C(5) |
| 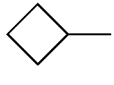 | C(4) |
|  | C(3)1 |

EXAMPLES

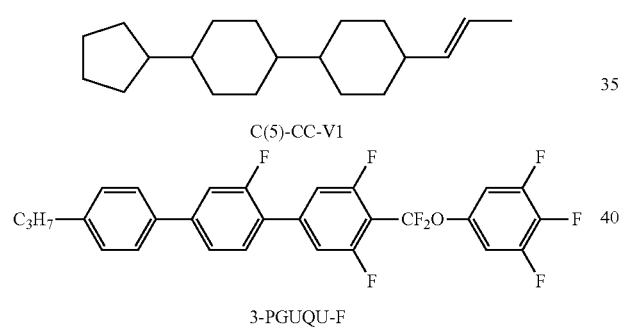

C(5)-CC-V1

3-PGUQU-F

The following specific embodiments are used to illustrate the present invention. The liquid crystal compositions provided in the embodiments of the present invention can be produced using a method of mixing liquid crystal compounds, e.g., a method of mixing different components at a high temperature and dissolving same in each other, and the liquid crystal compositions provided in the embodiments of the present invention may also be prepared according to other conventional methods, e.g., heating, ultrasonic wave, suspension and so on. The above-mentioned methods are all conventional methods, unless otherwise specified. The raw materials for preparing the liquid crystal compositions are all available from public commercial approaches, unless otherwise specified.

Example 1

This example provides a liquid crystal display device comprising an array substrate and an opposite substrate arranged facing the array substrate. The array substrate of the liquid crystal display device comprises slit electrodes, electrode gaps, an insulating layer, a bulk electrode, and a liquid crystal composition between the array substrate and the opposite substrate. In this example, the width of the slit electrodes is designed to be 3 μm, the electrode gap is designed to be 3 μm, the ratio of the width of the slit electrode to the width of the electrode gap is 1:1, and the included angle between the lengthwise direction of the slit electrodes and the lengthwise direction of the liquid crystal molecules is designed to be 5°.

The formulation of the liquid crystal composition and the design of the liquid crystal display device are as shown in table 3 below.

TABLE 3 formulation of liquid crystal composition and design of liquid crystal display device of Example 1

| Category | Liquid crystal monomer code | Content (%) |
|---|---|---|
| II | 3-CC-V | 50 |
| II | 3-CP-O2 | 5 |
| II | 3-CCP-1 | 2 |
| II | 3-CPPC-3 | 3 |
| III | 3-PUQY-F | 5 |
| III | 5-PGUQY-F | 3 |
| III | C(3)1-PUQY-F | 2 |
| III | C(3)1-PGUQY-F | 5 |
| III | 4-APUQY-F | 5 |
| I | 3-PUQY-O2 | 5 |
| I | C(5)-PUQY-O2 | 3 |
| I | 3-PGUQY-O2 | 2 |
| I | C(5)-PGUQY-O2 | 5 |
| I | 3-DGUQY-O2 | 5 | d = 3 μm
w = 3 μm
φ = 5°
Δε[1 KHz, 20° C.]: 2.5
$\varepsilon_\perp$: 4.7
Δn[589 nm, 20° C.]: 0.100
Cp: 78° C.
$\gamma_1$: 96 mPa · s.
Tr: 6.0%

Example 2

In this example, the width of the slit electrodes is designed to be 3 μm, the electrode gap is designed to be 6 μm, the ratio of the width of the slit electrode to the width of the electrode gap is 1:2, and the included angle between the lengthwise direction of the slit electrodes and the lengthwise direction of the liquid crystal molecules is designed to be 15°.

The formulation of the liquid crystal composition and the design of the liquid crystal display device are as shown in table 4 below.

TABLE 4 formulation of liquid crystal composition and design of liquid crystal display device of Example 2

| Category | Liquid crystal monomer code | Content (%) |
|---|---|---|
| II | 3-CC-V | 40 |
| II | 2-CC-3 | 2 |
| II | CC-V-V1 | 3 |
| II | 1-CPP-V | 3 |
| II | 3-CLP-2 | 2 |
| III | 3-PUQY-F | 5 |
| III | 5-PGUQY-F | 5 |
| III | 3-CPUQY-F | 3 |
| III | 4-APUQY-F | 3 |
| III | C(5)-PUQY-F | 2 |

TABLE 4-continued formulation of liquid crystal composition and design
of liquid crystal display device of Example 2

| Category | Liquid crystal monomer code | Content (%) |
|---|---|---|
| III | C(5)-PGUQY-F | 2 |
| I | 3-PUQY-O2 | 5 |
| I | 3-PUQY-O4 | 5 |
| I | 3-PGUQY-O4 | 5 |
| I | 3-PGUQY-O2 | 5 |
| I | 3-DGUQY-O2 | 10 | d = 3 μm
w = 6 μm
φ = 15°
Δε[1 KHz, 20° C.]: 4.0
$\varepsilon_\perp$: 4.6
Δn[589 nm, 20° C.]: 0.107
Cp: 81° C.
$\gamma_1$: 80 mPa · s.
Tr: 6.0%

Comparative Example 1

In this comparative example, the width of the slit electrodes is designed to be 3 μm, the electrode gap is designed to be 5 μm, the ratio of the width of the slit electrode to the width of the electrode gap is 3:5, and the included angle between the lengthwise direction of the slit electrodes and the lengthwise direction of the liquid crystal molecules is designed to be 7°.

The formulation of the liquid crystal composition and the design of the liquid crystal display device are as shown in table 5 below.

TABLE 5 formulation of liquid crystal composition and design of
liquid crystal display device of Comparative Example 1

| Category | Liquid crystal monomer code | Content (%) |
|---|---|---|
| II | 3-CC-V | 50 |
| II | 3-CP-O2 | 5 |
| II | 3-CCP-1 | 2 |
| II | 3-CPPC-3 | 3 |
| III | 3-PUQY-F | 5 |
| III | 5-PGUQY-F | 3 |
| III | C(3)1-PUQY-F | 2 |
| III | C(3)1-PGUQY-F | 5 |
| III | 4-APUQY-F | 5 |
| I | 3-PUQY-O2 | 5 |
| I | C(5)-PUQY-O2 | 3 |
| I | 3-PGUQY-O2 | 2 |
| I | C(5)-PGUQY-O2 | 5 |
| I | 3-DGUQY-O2 | 5 | d = 3 μm
w = 5 μm
φ = 7°
Δε[1 KHz, 20° C.]: 2.3
$\varepsilon_\perp$: 3.1
Δn[589 nm, 20° C.]: 0.101
Cp: 78° C.
$\gamma_1$: 130 mPa · s.
Tr: 5.4%

Comparative Example 2

This comparative example provides a liquid crystal display device comprising an array substrate and an opposite substrate arranged facing the array substrate. The array substrate of the liquid crystal display device comprises slit electrodes, electrode gaps, an insulating layer, a bulk electrode, and a liquid crystal composition between the array substrate and the opposite substrate. In this example, the width of the slit electrodes is designed to be 3 μm, the electrode gap is designed to be 3 μm, the ratio of the width of the slit electrode to the width of the electrode gap is 1:1, and the included angle between the lengthwise direction of the slit electrodes and the lengthwise direction of the liquid crystal molecules is designed to be 5°.

The formulation of the liquid crystal composition and the design of the liquid crystal display device are as shown in table 6 below.

TABLE 6

Formulation of liquid crystal composition and design of
liquid crystal display device of Comparative Example 2

| Category | Liquid crystal monomer code | Content (%) |
|---|---|---|
| II | CC-3-V | 50 |
| II | CP-3-O2 | 5 |
| II | CCP-3-1 | 2 |
| II | CPPC-3-3 | 3 |
| III | 3-PUQY-F | 5 |
| III | 5-PGUQY-F | 15 |
| III | C(3)1-PUQY-F | 10 |
| III | C(3)1-PGUQY-F | 5 |
| III | 4-APUQY-F | 5 | d = 3 μm
w = 3 μm
φ = 5°
Δε[1 KHz, 20° C.]: 2.4
$\varepsilon_\perp$: 3.0
Δn[589 nm, 20° C.]: 0.101
Cp: 75° C.
$\gamma_1$: 120 mPa · s.
Tr: 5.3%

In Example 1 and Comparative Example 1, the same liquid crystal composition is used, but different liquid crystal display device design schemes are used; and in Example 1 and Comparative Example 2, the same liquid crystal display device design scheme is used, but different liquid crystal compositions are used. The transmittances of the above-mentioned examples and comparative examples are tested, wherein the transmittance of Comparative Example 1 is 5.4%, the transmittance of Comparative Example 2 is 5.3%, and the transmittances of Example 1 and Example 2 are both 6%, and are increased by respectively 11% and 13% as compared with Comparative Example 1 and Comparative Example 2. By using the liquid crystal composition provided by the present invention to work with a liquid crystal display device, a higher transmittance is obtained, so that the liquid crystal display device achieves the effect of having a higher luminance or the effect of energy saving and power saving.

The liquid crystal compositions provided in the examples of the present invention have a good stability against light and heat, a lower viscosity, a wider refractive index that may be achieved by adjustment, and a higher clearing point (a very wide service temperature range), and in particular, the liquid crystal compositions have a higher light transmittance, thus allowing a display device to have a higher brightness or an energy saving effect. The liquid crystal display devices provided in the examples of the present application have a higher light transmittance, such that more backlight passes through the liquid crystal display device, resulting in the liquid crystal display device having a higher luminance. Alternatively, due to the increase in transmittance, using less backlight can achieve the same luminance as that in the prior art, and less backlight means lower power consumption. That is to say, the liquid crystal display device provided by the present invention has a higher luminance or has the effect of energy saving and power saving.

FIG. 1 is a schematic diagram of a liquid crystal display panel provided in an embodiment of the present invention, which mainly comprises: a liquid crystal composition 21, an array substrate 22 and an opposite substrate 23 arranged facing the array substrate. Specifically, the array substrate 22 comprises a first transparent substrate 221, a bulk electrode 223 and slit electrodes 224 for applying a voltage, and an insulating layer 222 between the bulk electrode 223 and the slit electrodes 224; and the opposite substrate 23 comprises a second transparent substrate 231, an opaque photoresistance 233, and a colour photoresistance 232. The colour photoresistance 232 is not limited to the RGB colours and may be the CMYK colour mode or a colour mode defined therefor.

Figure 2:
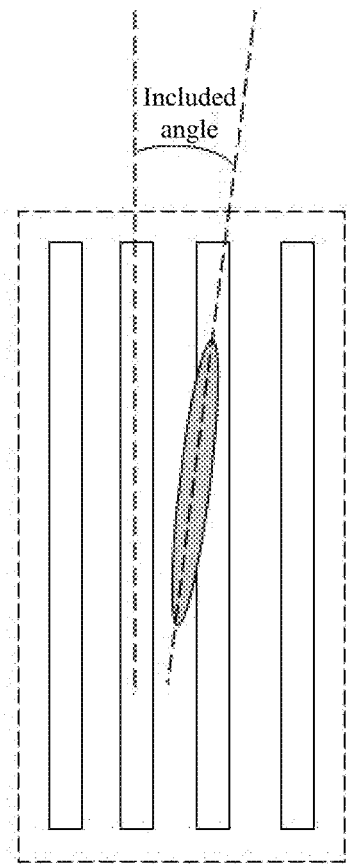
FIG. 2 shows a schematic diagram of the initial direction of liquid crystal molecules provided in an embodiment of the present invention in the lengthwise direction.

As shown in FIG. 2, the lengthwise direction of the slit electrodes is determined by the slit electrodes 224 on the array substrate, and the initial alignment direction of the liquid crystal molecules in the lengthwise direction is determined by a material or a process, the material or process including but not limited to a rubbing alignment film material, a photoalignment film material, and other alignment methods that do not require an alignment film; the included angle between the two needs to be adjusted according to the properties of the liquid crystal composition so as to achieve a higher transmittance and a faster response speed.

Figure 3:
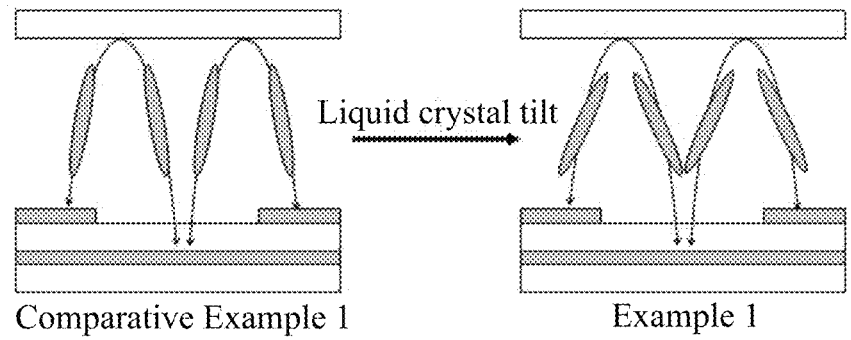
FIG. 3 shows a schematic diagram of the principle of improving light transmittance provided in an embodiment of the present invention.

As shown in FIG. 3, unlike Comparative Example 1, the liquid crystal composition of Example 1 has a better alignment direction under the action of an electric field, and the alignment direction thereof more tends to be horizontal, which improves the deflection effect of the liquid crystal composition on light.

Figure 4:
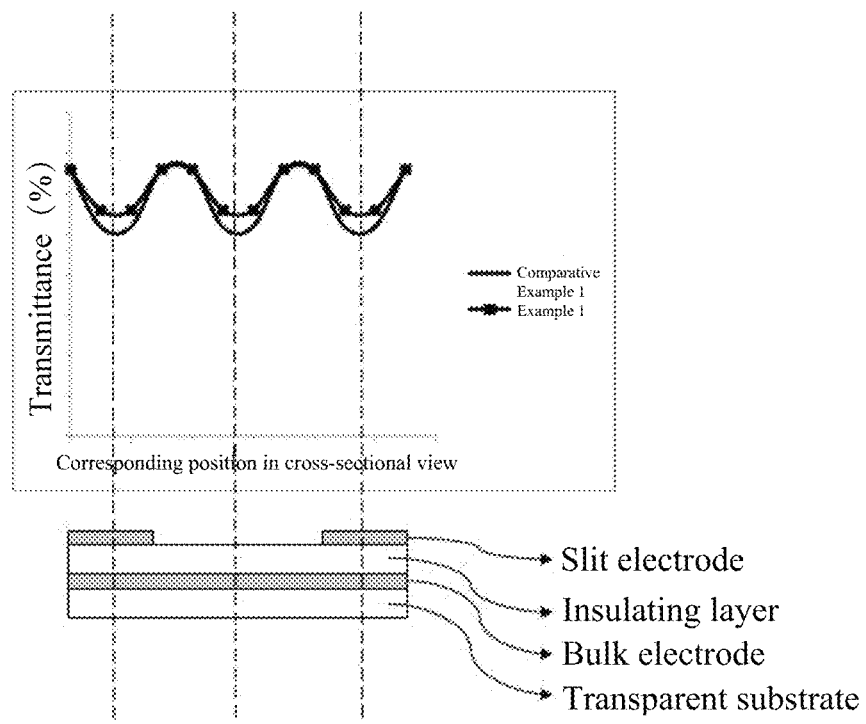
FIG. 4 shows a schematic diagram of the amplitude of improvement in light transmittance in different positions provided in an embodiment of the present invention.

As shown in FIG. 4, on the basis of FIG. 3, it is indicated in further detail that there are different transmittances at different positions of the slit electrode structure; in the position where the transmittance of the comparative example is lower, the example has a higher transmittance; overall, the example achieves a higher transmittance.

Obviously, the above-mentioned embodiments of the present invention are merely examples for clearly illustrating the present invention, rather than limiting the embodiments of the present invention; for a person of ordinary skill in the art, other variations or changes in different forms may also be made on the basis of the above description, all the embodiments cannot be provided exhaustively herein, and any obvious variation or change derived from the technical solution of the present invention is still within the scope of protection of the present invention.

The invention claimed is:

1. A liquid crystal display device comprising an array substrate and an opposite substrate arranged facing the array substrate, characterized in that further comprising a liquid crystal composition between said array substrate and the opposite substrate, wherein said array substrate comprises elongated and evenly spaced slit electrodes and electrode gaps between the slit electrodes, with the slit electrodes and the electrode gaps being located in the same layer structure; said array substrate comprises a bulk electrode below the slit electrodes; and said array substrate further comprises an insulating layer between the slit electrodes and the bulk electrode, said liquid crystal composition comprising liquid crystal molecules, and said liquid crystal composition comprising one or more compounds represented by formula I, and one or more compounds represented by formula II:

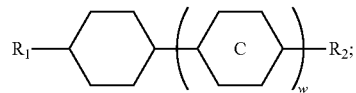

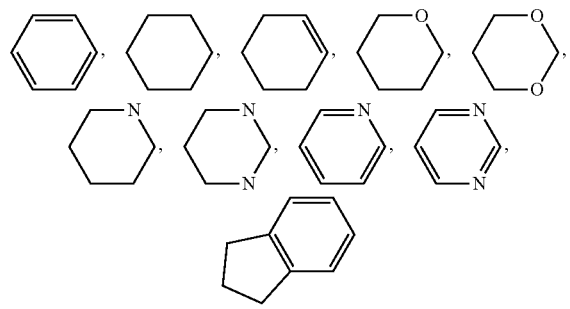

wherein

A represents a group having a dielectric constant of greater than 0, and B represents a group having a dielectric constant of less than 0;

$R_0$ represents one or more of $CF_2O$, $OCF_2$, $OCF_2O$, CHFO, OCHF, OCHFO, $CF_2$, CHF, $CH_2$, $CH_2CH_2$, $CHFCH_2$, $CH_2CHF$, CHFCHF, $CF_2CH_2$, $CH_2CF_2$, $CF_2CHF$, $CHFCF_2$, $CF_2CF_2$, CHCH, CFCH, CHCF, CFCF, Si, N, O, S, $CR*_2CR**_2$, $CR*FCR**_2$, $CR*_2CR**F$, $CR*FCRF$, $CF_2CR_2$, $CR*_2CF_2$, $CF_2CR**F$, $CR*FCF_2$, $CR*CR$, $CFCR$, $CR*CF$, and/or any fluorobenzene;

$R*$ and $R**$ each independently represent H, an alkyl group having a carbon atom number of 1-10, an alkoxy group having a carbon atom number of 1-10, an alkenyl group having a carbon atom number of 2-10, or an alkenoxy group having a carbon atom number of 3-8;

$R_1$ and $R_2$ each independently represent an alkyl group having a carbon atom number of 1-10, an alkoxy group having a carbon atom number of 1-10, an alkenyl group having a carbon atom number of 2-10 or an alkenoxy group having a carbon atom number of 3-8, and any one or more H in a $CH_2$ in the groups represented by $R_1$ and $R_3$ may be substituted with cyclopentyl, cyclobutyl, cyclopropyl, or —O—, wherein when more than one $CH_2$ in the groups represented by $R_1$ and $R_3$ comprise an H substituted with cyclopentyl, cyclobutyl, cyclopropyl, or —O—, such substituted $CH_2$ groups are non-consecutive;

represents one or more of

or any fluorobenzene;
and w represents 1, 2 or 3;
and wherein said liquid crystal composition further comprises one or more compounds represented by formula III:

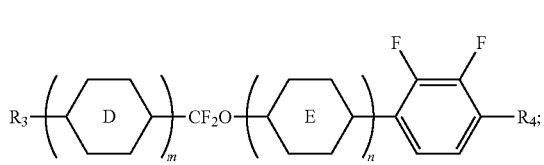

wherein
R₃ represents an alkyl group having a carbon atom number of 1-10, an alkoxy group having a carbon atom number of 1-10, an alkenyl group having a carbon atom number of 2-10 or an alkenoxy group having a carbon atom number of 3-8, and any one or more H in a CH₂ in the groups represented by R₃ may be substituted with cyclopentyl, cyclobutyl, cyclopropyl, or —O—, wherein when more than one CH₂ in the groups represented by R₃ comprise an H substituted with cyclopentyl, cyclobutyl, cyclopropyl, or —O—, such substituted CH₂ groups are non-consecutive;
R₄ represents F, CF₃, OCF₃, OCHF₂ or OCH₂F;

represents one or more of

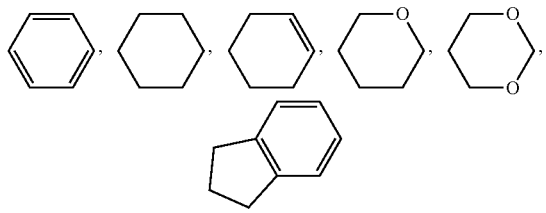

or any fluorobenzene;

represents one or two of benzene or fluorobenzene;
m represents 1, 2 or 3; and n represents 0 or 1.

2. The liquid crystal display device according to claim 1, characterized in that the ratio of the width of said slit electrode to the width of said electrode gap is 1:1 to 1:9.

3. The liquid crystal display device according to claim 1, characterized in that the ratio of the width of said slit electrode to the width of said electrode gap is 1:1 to 1:2.

4. The liquid crystal display device according to claim 1, characterized in that when said liquid crystal composition exhibits dielectrically positive characteristics, an included angle between a lengthwise direction of said slit electrodes and an initial alignment direction of said liquid crystal molecules in the liquid crystal composition in a lengthwise direction is 5° to 45°.

5. The liquid crystal display device according to claim 1, characterized in that when said liquid crystal composition exhibits dielectrically positive characteristics, an included angle between a lengthwise direction of said slit electrodes and an initial alignment direction of said liquid crystal molecules in the liquid crystal composition in a lengthwise direction is 5° to 15°.

6. The liquid crystal display device according to claim 1, characterized in that when said liquid crystal composition exhibits dielectrically negative characteristics, an included angle between a lengthwise direction of said slit electrodes and an initial alignment direction of said liquid crystal molecules in the liquid crystal composition in a lengthwise direction is 45° to 85°.

7. The liquid crystal display device according to claim 1, characterized in that when said liquid crystal composition exhibits dielectrically negative characteristics, an included angle between a lengthwise direction of said slit electrodes and an initial alignment direction of said liquid crystal molecules in the liquid crystal composition in a lengthwise direction is 75° to 85°.

8. The liquid crystal display device according to claim 1, characterized in that said one or more compounds represented by formula I are one or more of compounds represented by formulae I1 to I3 below:

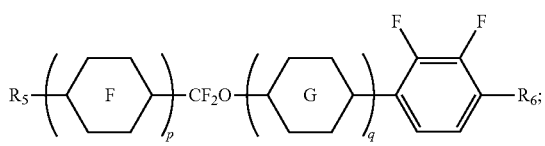

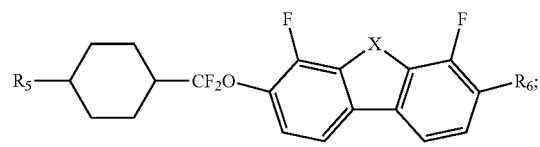

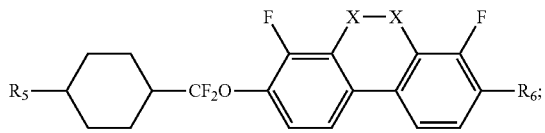

wherein
R₅ and R₆ each independently represent an alkyl group having a carbon atom number of 1-10, fluoro, a fluoro-substituted alkyl group having a carbon atom number of 1-10, an alkoxy group having a carbon atom number of 1-10, a fluoro-substituted alkoxy group having a carbon atom number of 1-10, an alkenyl group having a carbon atom number of 2-10, a fluoro-substituted alkenyl group having a carbon atom number of 2-10, an alkenoxy group having a carbon atom number of 3-8 or a fluoro-substituted alkenoxy group having a carbon atom number of 3-8, and any one or more H in a CH₂ in the groups represented by R₅ and R₆ may be substituted with cyclopentyl, cyclobutyl or cyclopropyl;

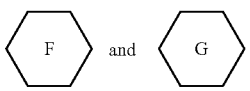

each independently represent one or more of

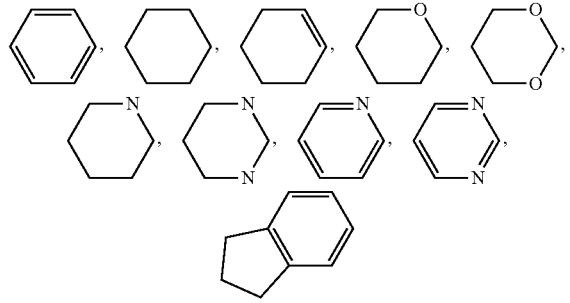

or any fluorobenzene;

each X independently represents $CH_2$, O or S;

p represents 1, 2 or 3; and q represents 0, 1 or 2.

9. The liquid crystal display device according to claim 8, characterized in that said compound represented by formula I1 is selected from one of compounds represented by formulae I1-1 to I1-14 below, said compound represented by formula I2 is selected from one of compounds represented by formulae I2-1 to I2-8 below, and said compound represented by formula I3 is selected from one of compounds represented by formulae I3-1 to I3-8 below,

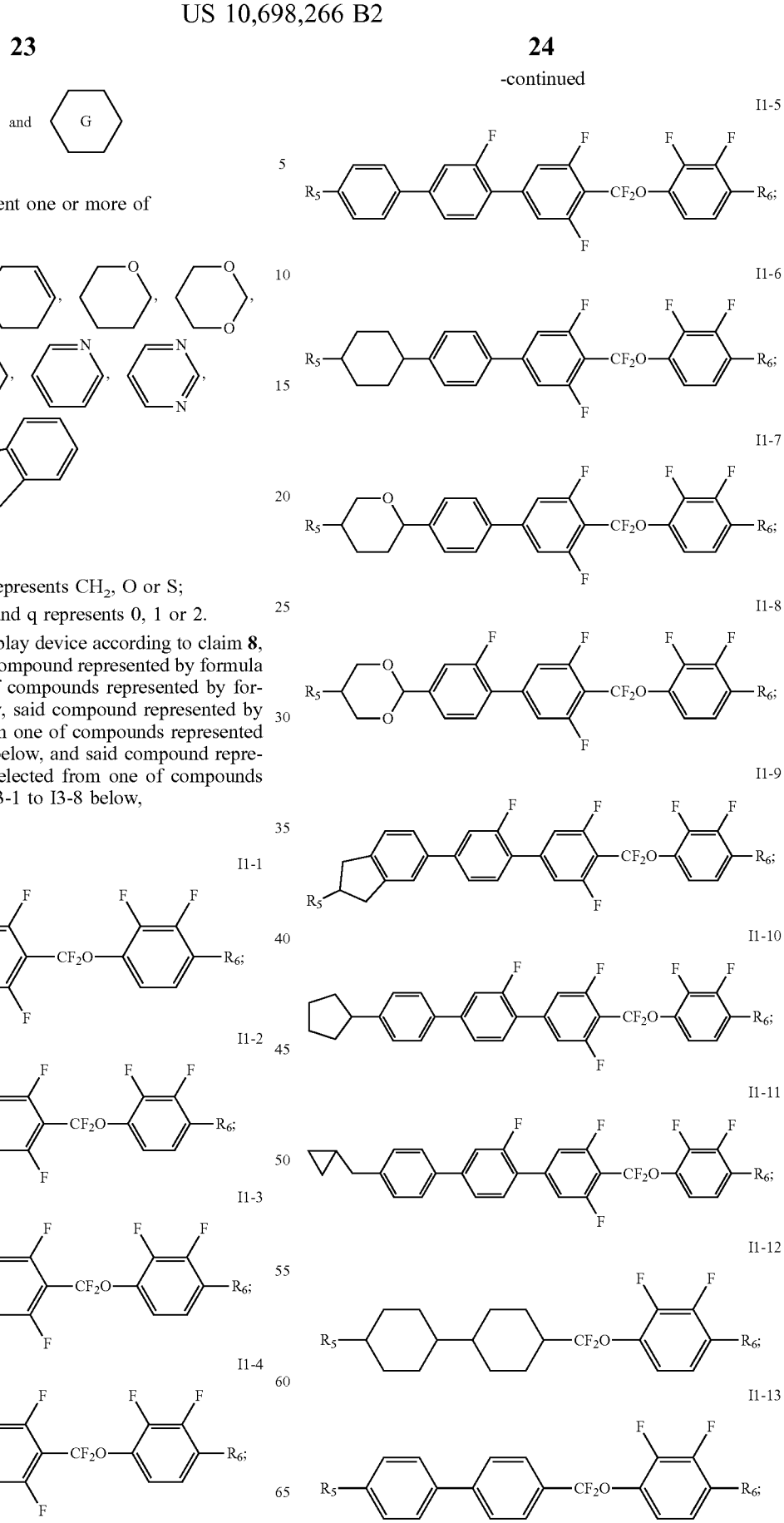

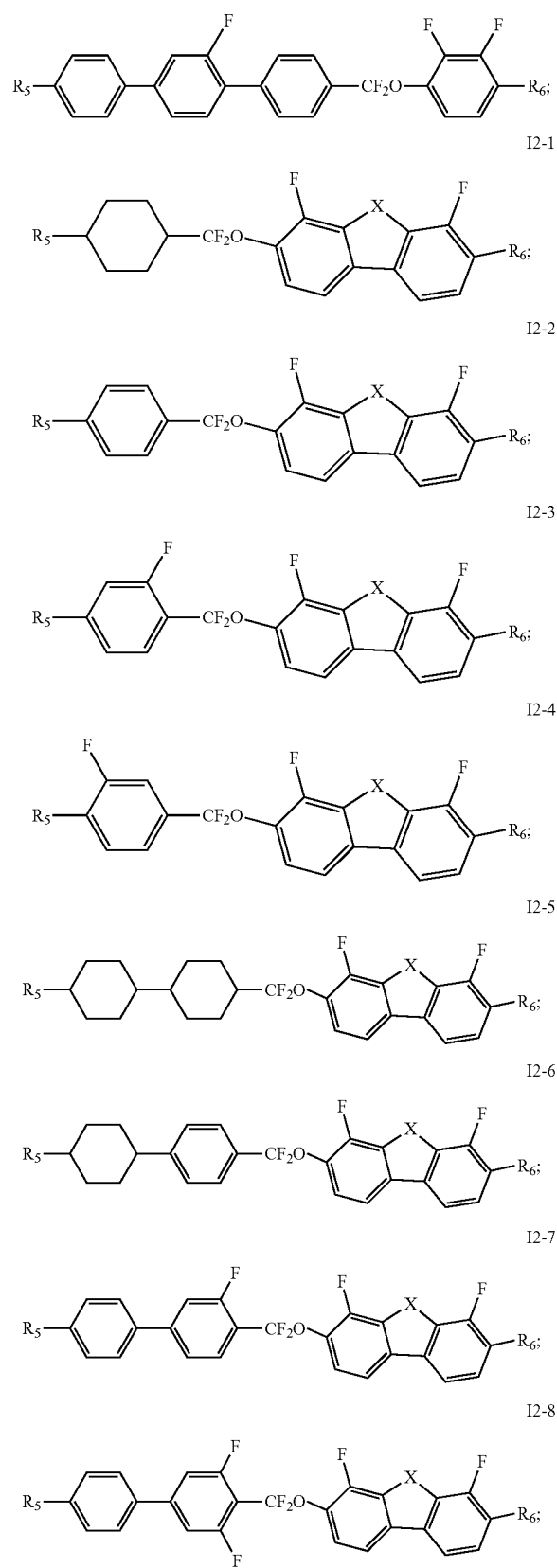

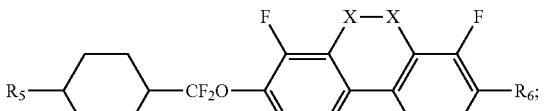

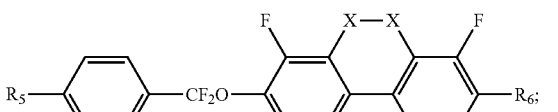

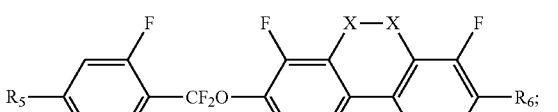

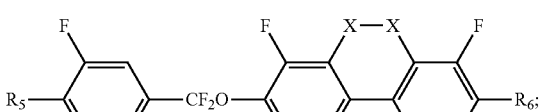

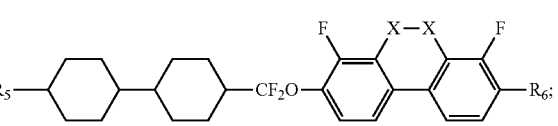

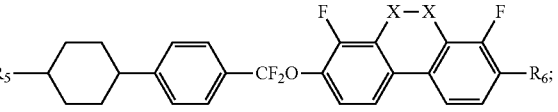

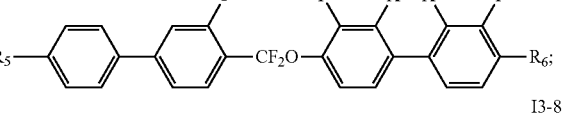

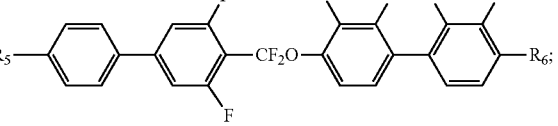

wherein $R_5$ and $R_6$ each independently represent an alkyl group having a carbon atom number of 1-10, fluoro, a fluoro-substituted alkyl group having a carbon atom number of 1-10, an alkoxy group having a carbon atom number of 1-10, a fluoro-substituted alkoxy group having a carbon atom number of 1-10, an alkenyl group having a carbon atom number of 2-10, a fluoro-substituted alkenyl group having a carbon atom number of 2-10, an alkenoxy group having a carbon atom number of 3-8 or a fluoro-substituted alkenoxy group having a carbon atom number of 3-8, and any one or more H in a $CH_2$ in the groups represented by $R_5$ and $R_6$ may be substituted with cyclopentyl, cyclobutyl or cyclopropyl;

and each X independently represents $CH_2$, O or S.

10. The liquid crystal display device according to claim 1, characterized in that said one or more compounds represented by formula II are selected from one or more of compounds represented by formulae II1 to II5 below, and said one or more compounds represented by formula III are selected from one or more of compounds represented by formulae III1 to III14 below:

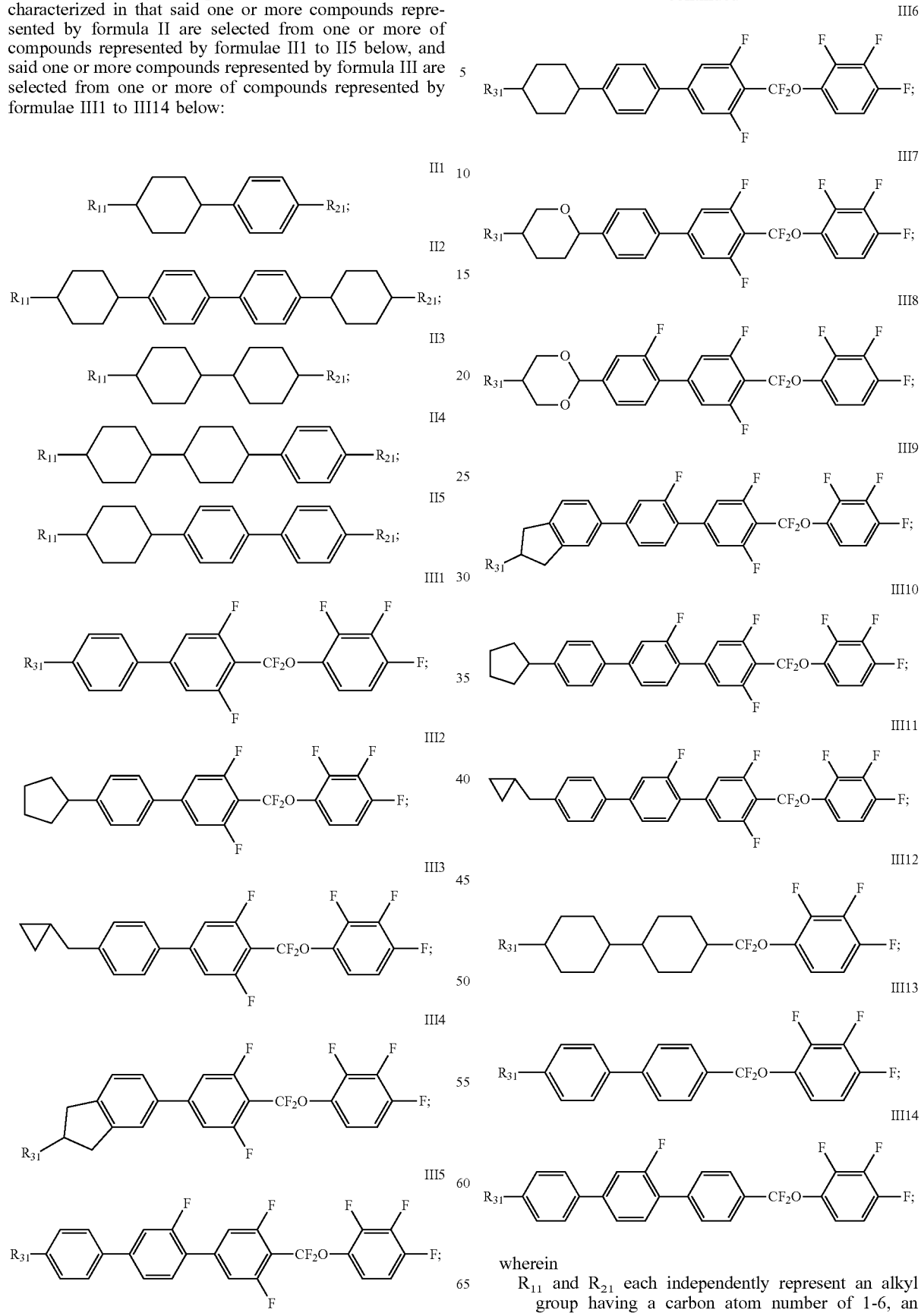

wherein
$R_{11}$ and $R_{21}$ each independently represent an alkyl group having a carbon atom number of 1-6, an alkoxy group having a carbon atom number of 1-6, an alkenyl group having a carbon atom number of 2-6 or an alkenoxy group having a carbon atom number of 3-6;

and $R_{31}$ represents an alkyl group having a carbon atom number of 1-6.

\* \* \* \* \*